United States Patent
Falke et al.

(10) Patent No.: US 9,299,532 B2
(45) Date of Patent: Mar. 29, 2016

(54) LOW-INTERFERENCE SENSOR HEAD FOR A RADIATION DETECTOR, AS WELL AS A RADIATION DETECTOR WHICH CONTAINS THIS LOW-INTERFERENCE SENSOR HEAD

(75) Inventors: Meiken Falke, Berlin (DE); Robert Kroemer, Berlin (DE)

(73) Assignee: Bruker Nano GmbH, Berlin (DE)

( * ) Notice: Subject to any disclaimer, the term of this patent is extended or adjusted under 35 U.S.C. 154(b) by 808 days.

(21) Appl. No.: 13/378,218

(22) PCT Filed: Jun. 15, 2010

(86) PCT No.: PCT/EP2010/058361
§ 371 (c)(1),
(2), (4) Date: Feb. 2, 2012

(87) PCT Pub. No.: WO2010/146044
PCT Pub. Date: Dec. 23, 2010

(65) Prior Publication Data
US 2012/0132818 A1    May 31, 2012

(30) Foreign Application Priority Data

Jun. 15, 2009  (DE) .................. 10 2009 026 946

(51) Int. Cl.
*G01T 1/24*        (2006.01)
*H01J 37/244*      (2006.01)
(Continued)

(52) U.S. Cl.
CPC ............... *H01J 37/244* (2013.01); *G01T 1/244* (2013.01); *H01J 37/256* (2013.01); *H01J 37/28* (2013.01); *G01T 1/24* (2013.01); *H01J 2237/0264* (2013.01); *H01J 2237/2442* (2013.01)

(58) Field of Classification Search
CPC ............. G01T 1/16; G01T 1/24; G01T 1/243; G01T 1/244; H01L 31/02002; H01L 31/0203; H01L 31/0256
USPC ................ 250/336.1, 370.01, 370.09, 370.14
See application file for complete search history.

(56) References Cited

U.S. PATENT DOCUMENTS 4,312,192 A * 1/1982 Zarudiansky et al. ......... 62/51.1
4,979,074 A * 12/1990 Morley ................ H05K 3/0061
165/185

(Continued)

FOREIGN PATENT DOCUMENTS

DE  10 2008 014 578 B3   11/2009
DE     102008028487 B3    1/2010
(Continued)

OTHER PUBLICATIONS

Glen F. Knoll, "Radiation Detection and Measurement", Third Edition, 1999, John Wiley & Sons, Inc., pp. 283-287.
(Continued)

*Primary Examiner* — David Porta
*Assistant Examiner* — Carolyn Igyarto
(74) *Attorney, Agent, or Firm* — Norris McLaughlin & Marcus, P.A.

(57) ABSTRACT

The invention relates to a low interference sensor head for a radiation detector and a radiation detector containing said low interference sensor head. Preferably, the radiation detector according to the invention is an X-ray detector. The invention further relates to the use of the low interference sensor head or the radiation detector, in particular of the X-ray detector for radiation analysis, in particular for (energy dispersive) X-ray analysis in microscopy using optics for charged particles.

14 Claims, 5 Drawing Sheets

(51) Int. Cl.
*H01J 37/256* (2006.01)
*H01J 37/28* (2006.01)

(56) References Cited

U.S. PATENT DOCUMENTS

| | | | |
|---|---|---|---|
| 5,841,135 A * | 11/1998 | Stoller et al. | 250/269.3 |
| 5,877,498 A | 3/1999 | Sugimoto | |
| 5,903,004 A | 5/1999 | Koshihara et al. | |
| 5,962,537 A | 10/1999 | Leviness | |
| 6,054,277 A * | 4/2000 | Furcht et al. | 435/6.11 |
| 7,279,081 B2 * | 10/2007 | Maeno et al. | 204/432 |
| 2004/0245474 A1 * | 12/2004 | Vieux et al. | 250/370.11 |
| 2004/0264632 A1 * | 12/2004 | Joshi et al. | 378/19 |
| 2005/0284210 A1 * | 12/2005 | Schmidt | G01N 11/162 73/32 A |
| 2006/0011852 A1 * | 1/2006 | El-Hanany et al. | 250/370.09 |
| 2006/0104419 A1 | 5/2006 | Sasayama et al. | |
| 2010/0022662 A1 * | 1/2010 | Gobelt et al. | 514/772.3 |
| 2011/0204229 A1 | 8/2011 | Schamber et al. | |

FOREIGN PATENT DOCUMENTS

| | | |
|---|---|---|
| EP | 1 227 315 A2 | 7/2002 |
| EP | 1914787 A1 | 4/2008 |
| JP | H3-48189 A | 3/1991 |
| JP | 8-212963 A | 8/1993 |
| JP | 8-83588 A | 3/1996 |
| JP | 2000-238046 A | 9/2000 |
| JP | 2002-501562 A | 1/2002 |
| JP | 2007048686 A | 2/2007 |
| JP | 2009-105037 A | 5/2009 |
| WO | 98/14979 A1 | 4/1998 |
| WO | WO 2008080580 A2 * | 7/2008 |
| WO | 2009/016407 A2 | 2/2009 |

OTHER PUBLICATIONS

Lowe B G Ed—EBS: David B. Williams et al:, "Chapter 2: Problems and Trends in X-Ray Detector Design for Microanalysis", pp. 7-19, Jan. 1995.
PN Sensors GmbH "PHSensor Research and Development of Advanced Radiation Sensors", Feb. 2007. XP55043766, http://web.archive.org/web/20070209125813; http://www.pnsensor.de/Welcome/index.html.
International Search Report dated Sep. 9, 2010, mailed Sep. 20, 2010.
English Translation of International Search Report dated Sep. 9, 2010, mailed Sep. 20, 2010.
McNally, et al, "Review of Solid State Photomultiplier Developments by CPTA and Photonique SA", Nuclear Instruments and Method in Physics Research A, pp. 150-153, 2009.
Japanese Office Action for corresponding JP Application No. 2012-515459 dated Jul. 2, 2014 with English Language Translation.
English Language Translation of European Office Action for corresponding EP Application No. 10 735 220.5 dated Apr. 27, 2015.
"PCB package for 9.0mm2 SSPMs"; Photonique SA, Nov. 27, 2007, p. 8, Geneva, Switzerland.
McNally, "Presentation for LIGHT 07", Photonique SA; Sep. 2007, pp. 1-23, Geneva, Switzerland.
Bell, et al., "Energy dispersive X-ray analysis in the electron microscope", Jan. 2003, No. of pp. 5.
"Is Stainless steel non-mmagnetic?", British Stainless Steel Association—Making the Most of Stainless Steel, Jan. 23, 2009, Sheffield, United Kingdom.
"Faszination Elektronik und Technik 2007/2008", Conrad Elektronik, Jan. 1, 2007, p. 1705, Germany.
"Kupfer-Zink-Legierungen (Messing und Sondermessing)" ["Copper—Zinc Alloys (Brass and Special Brass)"], Mar. 1, 2007, pp. 1-23, Deutsches Kupferinstitut, Duesseldorf, Germany.

* cited by examiner

A

B

LOW-INTERFERENCE SENSOR HEAD FOR A RADIATION DETECTOR, AS WELL AS A RADIATION DETECTOR WHICH CONTAINS THIS LOW-INTERFERENCE SENSOR HEAD

This application is a 371 application of PCT/EP2010/058361 filed Jun. 15, 2010, which claims foreign priority benefit under 35 U.S.C. §119 of German application 10 2009 026 946.0 filed Jun. 15, 2009.

The invention relates to a low interference sensor head for a radiation detector and a radiation detector containing said low interference sensor head. Preferably, the radiation detector according to the invention is an X-ray detector. The invention further relates to the use of the low interference sensor head or the radiation detector, in particular of the X-ray detector for radiation analysis, in particular for (energy dispersive) X-ray analysis in microscopy using optics for charged particles.

Historically, analysis in electron microscopes has developed as "electron ray microanalysis", a widely used element analysis method. Here, X-ray radiation which is created during the scanning of a sample by an electron beam in an electron microscope, for example in a scanning electron microscope (SEM), transmission electron microscope (TEM) or scanning/transmission electron microscope (STEM), is detected and evaluated. Initially planned only as a specialist application in connection with appliances designed specifically for this purpose, such as electron beam microsensors, X-ray analysis has in general now become one of the methods used routinely in almost every SEM/TEM laboratory. Here, different special analysis techniques such as wavelength dispersive (WDX) and energy dispersive X-ray analysis (EDX) (also known as WDS and EDS) are used.

The decisive step in this direction was the introduction of energy dispersive X-ray detectors (EDX detectors) which stand out for their simple and robust structure, low maintenance requirement, stable mode of operation and not least for the relatively wide solid angle which they cover.

EDX detectors have an input window, a semiconductor crystal, which is arranged axially in the view axis of the detector on a "cooling finger" and an amplifier unit which typically has a field effect transistor (FET) and a preamplifier. An EDX detector has a relatively large, homogeneous volume, which can capture X-ray radiation from almost any direction. In particular, the wide solid angle of the X-ray radiation captured by EDX detectors, i.e. the large share of the used radiation in relation to that generated overall, makes it possible to conduct a microanalysis of conventional, imaging electron microscopes.

The development of SEMs and TEMs towards a continuously improving electron optical resolution, the use of certain electron sources and energy dispersive electron filters, the improvement of electron detectors, as well as increased interest in organic samples, or samples with other sensitivities, have caused the standard beam current to decrease so greatly that in many cases, clear limits are set even with EDX detectors. This is of particular significance in the field of nanoanalysis, i.e. when sample areas of less than 1 micrometer are to be analysed fully and quantitively for their element and phase composition or contamination. Furthermore, small (in the nanometer range) or smaller thin sample areas have a lower excitation volume for interactive radiation, in particular X-ray radiation, and thus provide a lower level of radiation for the detector. In order to increase the recorded radiation level, the measuring times are routinely prolonged. The disadvantage here is above all that long measuring times are highly susceptible to interference due to sample drift.

Alternatively, larger-surface detectors can be used, which are however difficult to handle, have a poorer resolution and a poorer X-ray detection result, and which also require a higher degree of cooling.

These problems become particularly apparent with "SDD" detectors (silicon drift detectors), which on the basis of the physical effectiveness and structure could capture a radiation level many times greater than the standard. When there is a limit on the radiation level available due to the nature of the sample or the appliance, the only method of enlarging the radiation level captured and thus reducing the measuring time is to increase the solid angle of the radiation captured by the detector. For this purpose, the lowest distance possible between one or more smaller detectors and the sample is desirable.

The distance between the detector and the sample is however limited by the size of the detector and the structural features of the electron microscope. The optimum working distance between pole shoe and sample is approx. 4 mm in the SEM, whereby an enlargement of this working distance significantly decreases the quality of the image. When using the EDX in TEM and STEM systems, the available detector sizes are also limited by the special design features in the TEM, since the sample is located in the pole shoe of the electron lenses.

In order to position the EDX detector as closely as possible to the sample, i.e. optimally between the pole shoe and the sample in the electron microscope, the detectors must be reduced in size. A correspondingly miniaturised detector is described for example in DE 10 2008 014 578.5.

The inventors have observed that due to the spatial proximity of the detector, the fields for electron beam focussing or deflection can however be disturbed. This is a significant problem in particular with TEM/STEM systems, where the sample is located in the pole shoe of the electron lens. If the field progression of the electronic lens generated is disturbed by the detector, the quality of the image is significantly decreased, or no image at all is possible. To this is added the fact that in the interim, electron microscopes with corrected spherical and in future also chromatic aberration will be launched onto the market. For these appliances, the interference of the lens field in the optics is particularly damaging, since the functioning of the aberration correctors is thus also disturbed or completely disabled.

It is thus the object of the present invention to overcome the problems of the prior art and to provide a low interference detector for EDX. Here, it should be possible to move the detector close to the optics in electron microscopes to within a distance of a few millimeters, without negatively impacting the image quality of the microscopes or causing the aberration correctors to be disturbed or completely disabled.

The object is attained according to a first aspect of the invention by means of a low interference sensor head with the features described in claim 1. Further embodiments of the invention are described in the features of the subclaims.

The invention relates to a low interference sensor head for a radiation detector, comprising as components at least one printed circuit board with a front surface, a sensor chip arranged on the front surface of the printed circuit board and sensitive to radiation, a plurality of signal and control connections containing contact pins, and a means for cooling and/or heat removal arranged on a side of the printed circuit board facing away from the front surface, wherein the majority of the contact pins consists of one material or several materials with a relative permeability ($\mu_r$) of less than 1.5.

Surprisingly, it was discovered that a standard sensor head causes significant interference to the electron optics. According to the invention, the sensor head is thus constructed in such a manner that it only causes low level interference to the optics for charged particles. Here it is surprising that the contact pins of the signal and control connections make the largest contribution to the interference caused by the sensor head. In one embodiment of the invention, the contact pins are electrically conducting materials in the form of pins which are preferably gold-plated.

In one preferred embodiment of the invention, the contact pins are solid cylinders with a diameter ranging from 0.1 to 1.5 mm, preferably 0.4 to 0.8 mm. A preferred length of the contact pins ranges from 0.1 to 3 cm, preferably from 0.5 to 2 cm, even more preferably from 1 to 1.5 cm. The design as a cylinder is advantageous in terms of production, although according to the invention, square or polygonal rods in the given size ranges are also possible. The round or polygonal contact pins can essentially be straight or curved. Curved contact pins are preferably used when required by the detector geometry.

In order to minimise the influence on the optics for charged particles, according to the invention, the majority of the contact pins is produced from one material or several materials with a relative permeability ($\mu_r$), also known as relative permeability or magnetic relative permeability, of less than 1.5. In one preferred embodiment of the invention, ⅔ of the contact pins, and even more preferred, all contact pins, are produced from one material, the relative permeability ($\mu_r$) of which is less than 1.5.

In a particularly preferred embodiment of the invention, the contact pins are produced from one material or several materials, the relative permeability ($\mu_r$) of which is less than 1.35, preferably less than 1.2, and even more preferably less than 1.1, further preferably less than 1.05 and even further preferably less than 1.01. Furthermore, the material properties, particularly the magnetic permeability of the materials used according to the invention must be reversible following mechanical processing; in particular, no permanent increase in permeability may be caused by the processing. Furthermore, the thermal expansion coefficients of the materials used according to the invention must be coordinated with each other. Suitable materials for the contact pins according to the invention comprise austenitic stainless steel, annealed nickel alloys, tantalum, zirconium, tungsten, platinum, palladium, titanium or mixtures thereof. A particularly preferred material for the contact pins according to the invention is an annealed austenitic stainless steel or a tungsten-titanium alloy. According to the invention, tungsten-titanium alloys containing traces of other metals are also possible.

All the known materials from the prior art are possible as a base material for the printed circuit board. For example, paper saturated in phenolic resin or epoxy resin, glass fibre tissue saturated in epoxy resin, teflon, polyester film or ceramic can also be used. The conductor paths consist of the conductive materials known to persons skilled in the art, preferably copper. In a particularly preferred embodiment of the invention, the printed circuit board is a multilayer compound ceramic. The production of corresponding compound ceramics is known to persons skilled in the art.

All sensor chips sensitive to particle radiation known to persons skilled in the art can be used as a sensor chip. According to the invention, particle radiation preferably refers to radiation including charged particles such as ions or electrons, but also to photon radiation, in particular such as X-ray radiation. Preferably, sensor chips are used which are sensitive to X-ray radiation. Suitable sensor chips are for example an Si(Li) detector, a high purity germanium detector (HPGe detector), a positive intrinsic negative diode (PIN diode), a detector consisting of connector semiconductors, a silicon drift detector (SDD) with external transistors or a silicon drift detector with integrated FET (I-FET SDD). Preferably, the sensor chip used according to the invention is a silicon drift detector (SDD).

In order to stabilise the thermal conditions and, if appropriate, to generate working temperatures which lie below room temperature, the sensor head has a means for cooling and/or heat removal on the rear side of the printed circuit board. Suitable means for cooling and/or heat removal are known to persons skilled in the art. Preferably, the means for cooling and/or heat removal comprises a thermoelectric cooling element.

In a further embodiment of the invention, the sensor head according to the invention furthermore comprises a base plate for holding the contact pins, wherein the base plate consists of one material or several materials, the relative permeability ($\mu_r$) of which is less than 1.5. Preferably, the base plate comprises bore holes which retain the contact pins according to the invention and mechanically affix them. In one preferred embodiment, the base plate is designed as a ring. The means for cooling and/or heat removal is guided through the central opening of the base plate, or the central opening of the base plate is filled by the means for cooling and/or heat removal. Suitable materials for the base plate according to the invention must, alongside a relative permeability ($\mu_r$) of less than 1.5, also have sufficient mechanical stability so that the base plate will not be distorted while the detector is in operation, and the contact pins are reliably held in their position. Here, the thickness of the base plate ranges from 0.1 to 5 mm, preferably from 0.5 to 3 mm, even more preferably from 1.5 to 2.5 mm. Additionally, the material must be selected in such a manner that bore holes can be inserted and, if possible, no alterations to the magnetic permeability of the base plate are induced due to the mechanical processing.

It is particularly preferred that the material of the base plate has a relative permeability ($\mu_r$) of less than 1.35, preferably less than 1.2, even more preferably less than 1.1, further preferably less than 1.05 and even further preferably less than 1.01. Suitable materials for producing the base plate according to the invention comprise austenitic stainless steel, annealed nickel alloys, tantalum, zirconium, tungsten, platinum, palladium, titanium or mixtures thereof. In one preferred embodiment, the base plate according to the invention consists of annealed austenitic stainless steel, and particularly preferred of annealed stainless steel with material number 1.4429, 1.4406, 1.4404, 1.4301, 1.3964, 1.3960 or 1.3952, in particular material number 1.4301.

In a further preferred embodiment of the invention, the sensor head is enclosed by a housing, wherein the housing comprises an input window in the area of the sensor chip, and the housing consists of one material or several materials, the relative permeability ($\mu_r$) of which is less than 1.5. Here, the input window is permeable for the radiation detected by the sensor chip. The housing offers protection to the sensitive components of the sensor head against mechanical impact, while at the same time acting as a gripping surface.

In a further preferred embodiment of the invention, the sensor head is enclosed in the side areas by a housing, wherein the housing ends flush with the sensor chip.

In both alternative embodiments, i.e. with and without input window, the housing can in one design be vacuum sealed, and in another design be open.

Preferably, the materials for a housing according to the invention have a relative permeability ($\mu_r$) of less than 1.35, preferably less than 1.2, more preferably less than 1.1, further preferably less than 1.05 and even more preferably less than 1.01. Suitable materials for a housing according to the invention comprise an austenitic stainless steel, annealed nickel alloys, tantalum, zirconium, tungsten, platinum, palladium, titanium or mixtures thereof. In one preferred embodiment, the housing according to the invention consists of annealed austenitic stainless steel, particularly preferred of annealed stainless steel with material number 1.4429, 1.4406, 1.4404, 1.4301, 1.3964, 1.3960 or 1.3952, in particular material number 1.4301.

In a further embodiment of the invention, the adhesive layers and/or barrier layers between the components are thinner than 3 µm, preferably thinner than 2 µm, more preferably thinner than 1.5 µm. Adhesive layers are used for example on the contact pins, in order to be able to stably apply the gold plate. Barrier layers are used to prevent diffusion between the individual components.

In a further preferred embodiment, the adhesive layers and/or barrier layers consist of one material or several materials, the relative permeability ($\mu_r$) of which is less than 1.5, preferably less than 1.35, more preferably less than 1.2, even more preferably less than 1.1, further preferably less than 1.05 and even further preferably less than 1.01.

In a further embodiment, the individual components are connected to each other without soldering or by means of a solder, the relative permeability ($\mu_r$) of which is less than 1.5, preferably less than 1.35, more preferably less than 1.2, even more preferably less than 1.1, further preferably less than 1.05 and even further preferably less than 1.01. Further suitable soldering materials for the sensor head according to the invention contain less than 50% nickel, preferably less than 20% nickel, even more preferably less than 10% nickel, further preferably less than 5% nickel, and most preferably 0% nickel. Advantageously, solders according to the invention are used which have a melt temperature of $T_m \geq 600°$ C., preferably $T_m \geq 900°$ C. Here, it should be noted that the thermal expansion coefficients of the materials used must be coordinated with each other. Suitable solders comprise silver, gold, copper, palladium or a mixture thereof. Preferably, the solder consists of a mixture of silver and copper. According to the invention, silver-copper mixtures containing traces of other materials are also possible.

In a further embodiment of the invention, the contact pins are preferably enclosed by a tubular glass body, which is open at both ends and thus leaves the contact pin free to be contacted, in order to provide insulation and to avoid unwanted electric conductivity. Here, the glass of the glass encasement is selected in such a manner that the melt temperature of the glass is greater than or equal to the annealing temperature of the stainless steel. Advantageously, as a result, the stainless steel is annealed at the same time during the glass encasing process. This is particularly advantageous when due to the processing and forming of the contact pins, an alteration in the magnetic permeability of the stainless steel has been caused. Here, it should be noted that the thermal expansion coefficients of the materials used must be coordinated with each other.

In a further embodiment, soldering, annealing and glass encasement are completed in a single processing step.

In a further embodiment of the invention, the means for cooling and/or heat removal comprises a thermoelectric cooling element and a base. The thermoelectric cooling element preferably comprises several Peltier elements which are arranged between two ceramic plates. The ceramic plates represent the cold and warm side of the thermoelectric cooling element, wherein the cold side is the side facing the printed circuit board. In one embodiment, the cold side is connected to the printed circuit board via a cooling means or heat conducting material. In a further embodiment, the cold side of the thermoelectric cooling element is at the same time the printed circuit board. Suitable materials for the thermoelectric cooling element are aluminium oxide ceramics, aluminium nitride ceramics, bismuth telluride and silicon germanium.

The base serves to mechanically affix the components of the sensor head while at the same time acting as means for heat removal. Preferably, the base consists of a material with good heat conducting properties. Suitable materials for a base according to the invention are copper, silver, gold, or mixtures thereof. Preferably, copper is used to produce the base. If the base plate according to the invention is designed as a ring, the base fills out the central opening in the base plate.

Due to the selection and combination of materials according to the invention, it is possible to provide a sensor head which meets current EDX standards of sensitivity, stability and geometric requirements, and furthermore is low interference and which only slightly influences the optics for charged particles. Thus, a sensor head is provided which retains the image quality and resolution in SEM or TEM while at the same time opening up the opportunities of nanoanalysis by means of radiation analysis, in particular by means of EDX.

A further object of the invention is to provide a radiation detector which is equipped with a low interference sensor head according to the invention. According to the invention, the low interference sensor head according to the invention can be installed in all types of detectors which can be used for detecting particle radiation. According to the invention, particle radiation preferably refers to radiation including charged particles such as ions or electrons, but also to photon radiation such as X-ray radiation.

In a particularly preferred embodiment of the invention, the radiation detector according to the invention is an X-ray detector, in particular an EDX detector, which comprises a low interference sensor head according to the invention.

The invention furthermore relates to the use of a low interference sensor head according to the invention or a radiation detector according to the invention for detecting particle radiation, preferably X-ray radiation, in a microscope with optics for charged particles, in particular in an electron or ion microscope. Preferably the low interference sensor head or the detector with a low interference sensor head according to the invention is installed in scanning electron microscopes (SEM) and all types of transmission electron microscopes (TEM), in particular scanning transmission electron microscopes (STEM), in SEMs with a TEM pole shoe, in FIB appliances (focussed ion beam) with combined electron and ion optics, and in ion microscopes.

The invention will now be explained in greater detail with reference to exemplary embodiments and the related drawings, in which.

Figure 1:
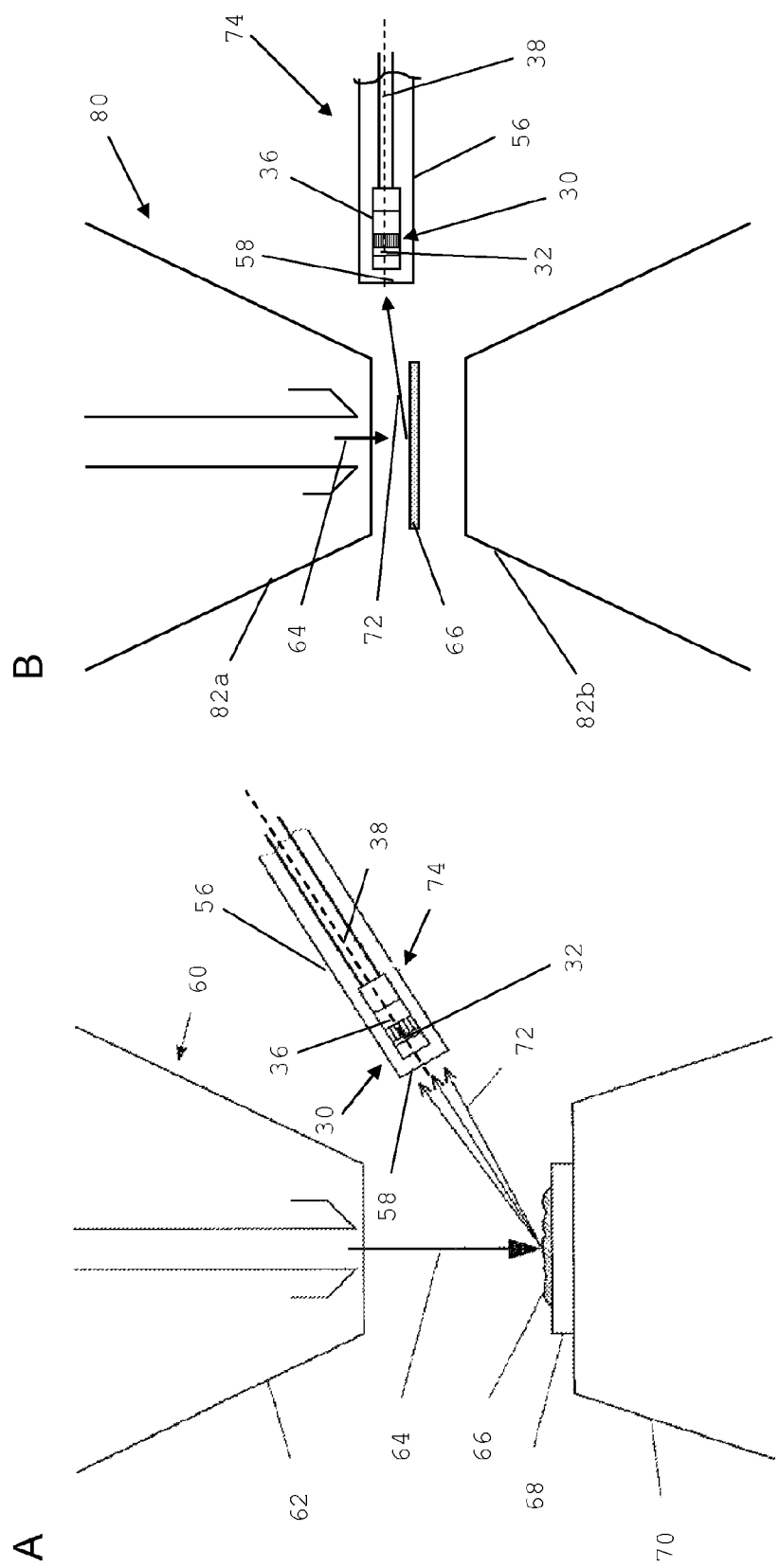
FIGS. 1A and 1B show diagrammatic models for the EDX with a radiation detector 74 on the SEM (FIG. 1A) and on the TEM (FIG. 1B)

FIGS. 4A and 4B show image qualities in a TEM after swinging in the radiation detector with a low interference sensor head 30 according to the invention; and FIG. 1A shows in diagrammatic form an experimental model for the EDX, in which an SEM designated overall with the reference numeral 60 comprises a pole shoe 62, out of which an electron beam 64 exits. The electron beam 64 is aligned to a sample 66 which is retained by a sample holder 68, which is located on a sample bench 70. The electron beam 64 which exits from the pole shoe 62 of the electron microscope 60 protrudes into the sample 66 retained in the sample holder 68. As a result, radiation 72 is emitted by the sample 66 and subsequently detected in a radiation detector 74. The embodiment shown the radiation is X-ray radiation 72, and the detector is accordingly also an X-ray detector 74.

The EDX detector 74, of which here only the "cooling finger" is shown, comprises a sensor head 30 with a semiconductor crystal as a sensor chip 32. An X-ray sensitive front surface of the sensor chip 32 is irradiated by the entering X-ray radiation 72. On the rear side of the sensor head 30, the X-ray detector 74 comprises a means for cooling and/or heat removal 36, which in particular comprises a thermoelectric cooling element. The sensor head 30 and the thermoelectric cooling element are enclosed by a housing 56. In the area of the sensor chip 32, the housing 56 comprises an input window 58 which is optionally permeable to the X-ray radiation 72. The angle between the detector axis 38 (broken line) and sample standards can be altered by tipping the detector and the sample. The detector height is also variable.

FIG. 1B shows in diagrammatic form a TEM 80 with EDX. The sample 66 is here arranged in the pole shoe, i.e. between the upper pole shoe section 82a and the lower pole shoe section 82b. The electron beam 64 exits from the upper pole shoe section 82a and radiates through the sample 66. As a result of the irradiation, X-ray radiation 72 is emitted from the sample 66, which is subsequently detected in an X-ray detector 74. The X-ray detector 74 corresponds to the EDX X-ray detector 74 shown in FIG. 1A.

Figure 2:
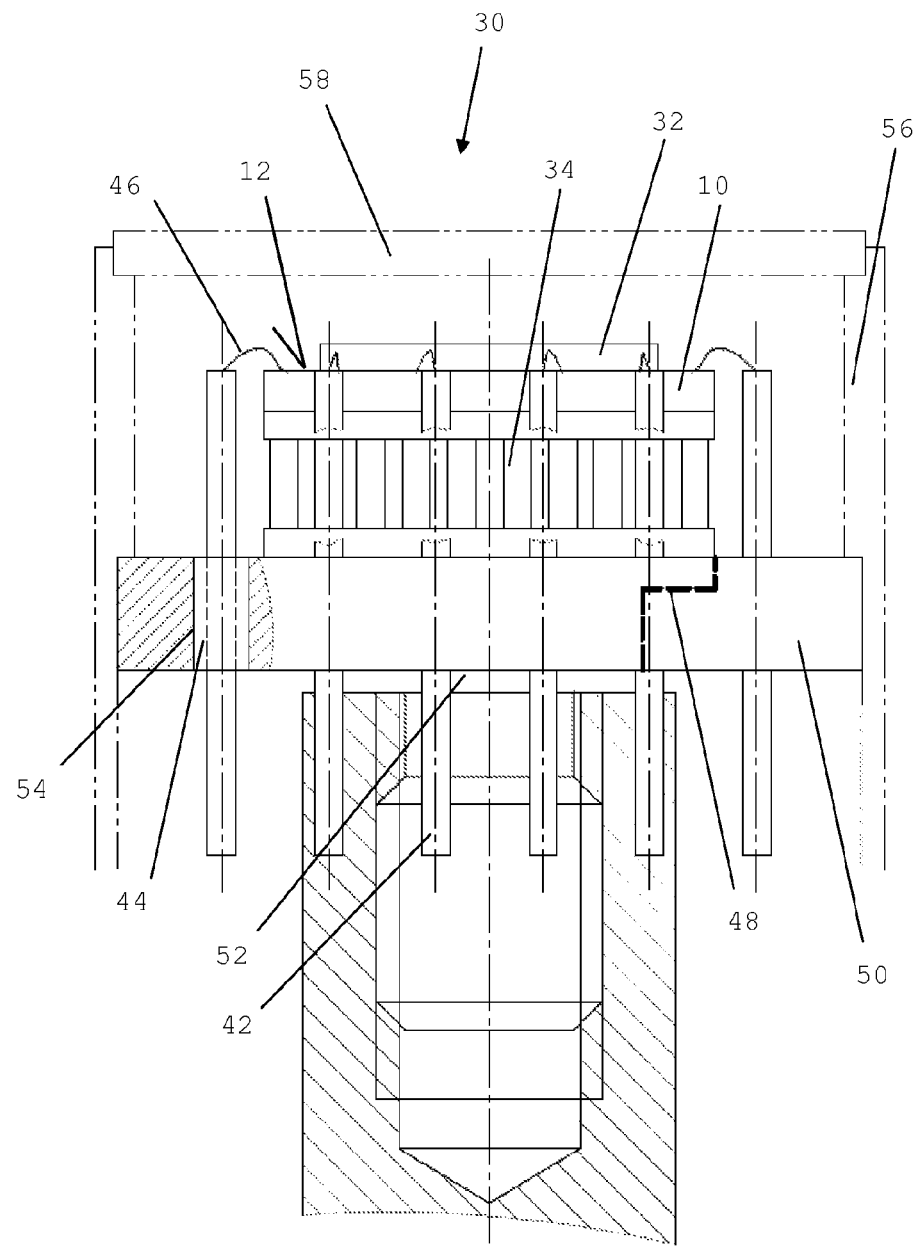
FIG. 2 shows a low interference sensor head 30 according to the invention in a side view.

FIG. 2 shows a sensor head 30 according to the invention for an X-ray detector 74 in diagrammatic form in a side view. A sensor chip 32 is mounted centrally on a front surface 12 of a printed circuit board 10. The sensor chip 32 is a silicon chip, and the printed circuit board 10 is a multilayer compound ceramic. On a side facing away from the front surface 12, a cooling element 34 is arranged. The cooling element 34 is a thermoelectric cooling element, in particular with bismuth telluride Peltier elements.

The sensor chip 32, the printed circuit board 10 and the thermoelectric cooling element 34 are mounted onto a base 52 for mechanical affixation, which forms the centre of a ring-shape base plate 50 made of annealed austenitic stainless steel 1.4301. The base 52 and the base plate 50 are soldered for affixation. As a solder 48, a 1:1 mixture of copper and silver has been used. The diameter of the base plate 50 is greater than the diagonal of the front surface 12 of the printed circuit board 10. In the edge areas of the base plate 50, bore holes 54 are located which are arranged in the base plate 50 in such a manner that they are not covered by the front surface 12 of the printed circuit board 10. The bore holes 54 retain tubular glass bodies 44 together with the contact pins 42 located therein. The contact pins 42 represent the signal and control connections required for operating the sensor chip 32, and are made of a tungsten-titanium alloy. On the side facing towards the sensor chip 32, the contact pins 42 end flush in the selected diagrammatic drawing with the front surface 12 of the printed circuit board 10. From the ends of the contact pins 42, bond wires 46 in the form of a loop lead to bonding islands mounted on the printed circuit board 10. The sensor head 30 is enclosed by a housing 56 made of austenitic stainless steel 1.4301. In the area of the sensor chip 32, the housing 56 comprises an input window 58 which is permeable to X-ray beams 72.

Figure 3:
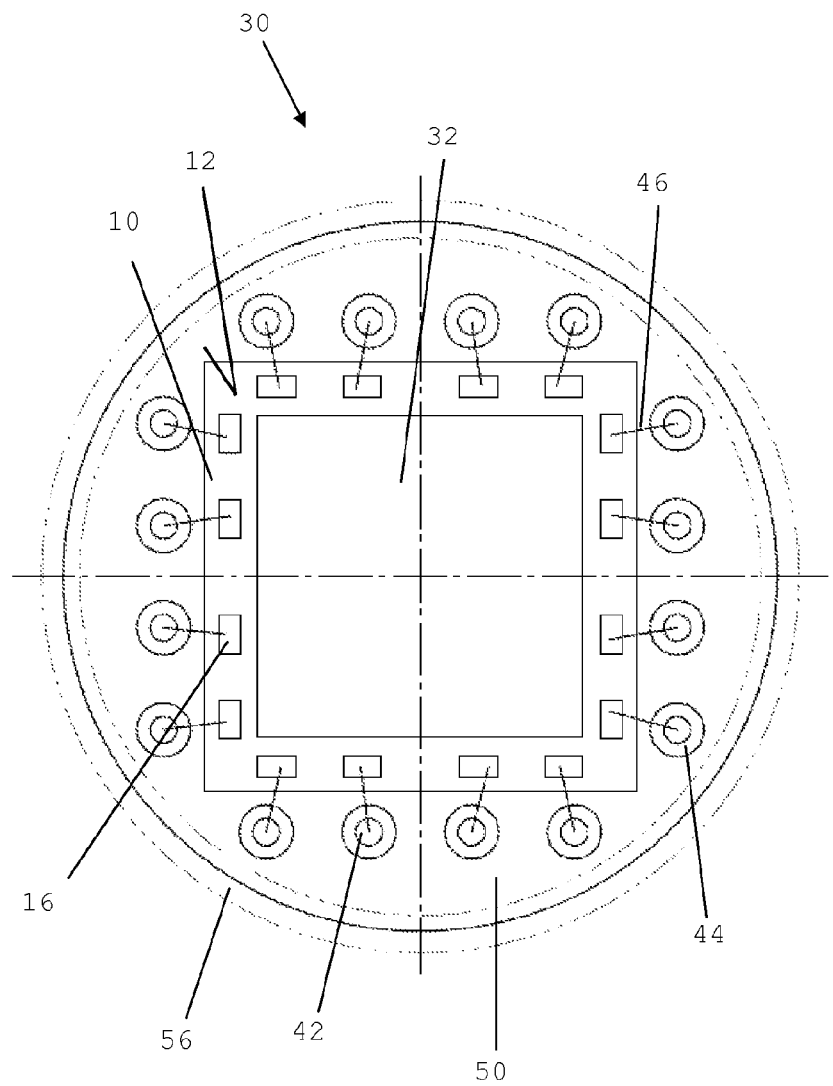
FIG. 3 shows a low interference sensor head 30 according to the invention in a top view.

FIG. 3 shows the sensor head 30 according to the invention for the X-ray detector 74 in diagrammatic form an in a top view. The description of the components of the sensor head 30 is given from top to bottom. The sensor chip 32 and the printed circuit board 10 located below it have a square base surface, wherein the front surface 12 of the printed circuit board 10 is larger than the surface of the sensor chip 32. On the front surface 12 of the printed circuit board 10, bonding islands 16 are mounted along the side surfaces of the sensor chip 32, from which bond wires 46 lead to the contact pins 42. The contact pins 42 are arranged with the glass bodies 44 in the bore holes of the base plate 50, wherein the diameter of the base plate 50 is greater than the diagonal of the front surface 12 of the printed circuit board 10, so that the contact pins 42 are arranged outside the front surface 12 of the printed circuit board 10. The sensor head 30 is enclosed by the housing 56. The diameter of the housing 56 is greater than the diameter of the base plate 50.

Figure 4:
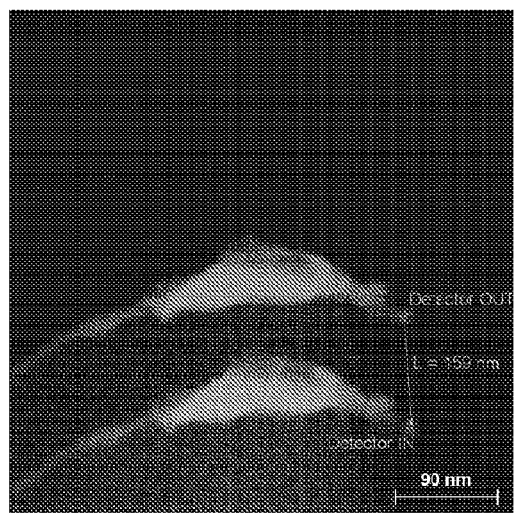
Figure 4:
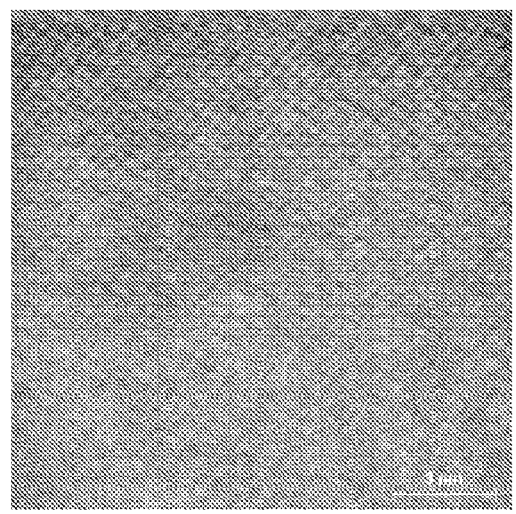
Figure 5:
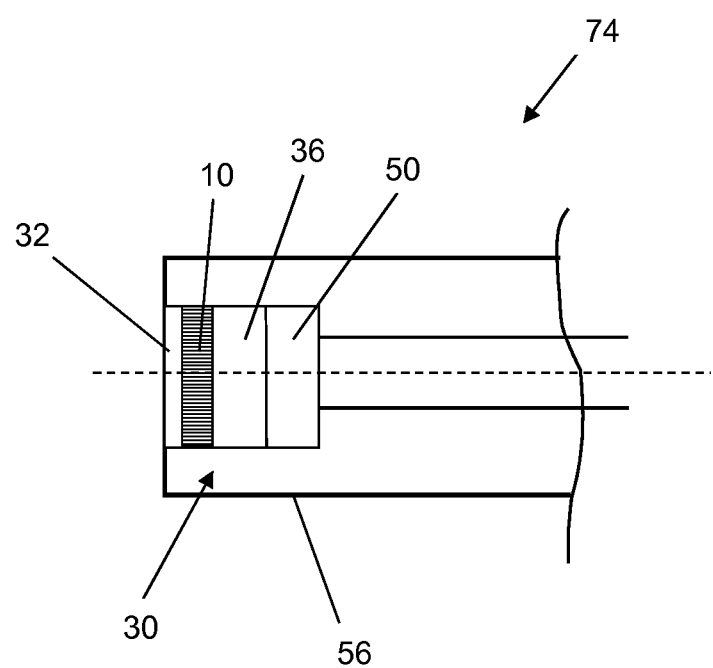

FIG. 4 shows two exemplary images taken with a Jeol 220 FS at 200 KeV acceleration voltage. The detector was advanced in the TEM pole shoe to a distance of 15.7 mm from the sample. If a detector according to the invention advances towards the sample in this manner, the image displacement is still 159 nm (FIG. 4A). The image quality is not further impaired. When a standard detector is used, the image would be localised outside of the image field following the advance of the detector.

FIG. 4B shows the high resolution scanning image of silicon in [110] zone axis in high annular dark field mode. The detector again advances towards the sample to a distance of 15.7 mm. The image function of the electron lens is only minimally impaired by the detector; the scanning structure can be easily detected.

LIST OF REFERENCE NUMERALS

10 Printed circuit board
12 Front surface
16 Bonding island
30 Sensor head
32 Sensor chip
34 Thermoelectric cooling element
36 Means for cooling and/or heat removal
38 Detector axis
42 Contact pin
44 Glass body
46 Bond wire
48 Solder
50 Base plate
52 Base
54 Bore hole
56 Housing
58 Input window
60 SEM
62 Pole shoe
64 Electron beam
66 Sample
70 Sample holder
72 Sample bench
72 (X-ray) radiation
74 (X-ray) radiation detector
80 TEM
82a Upper pole shoe section
82b Lower pole shoe section

The invention claimed is:
1. A low interference sensor head for a radiation detector, wherein
    the radiation detector comprises a plurality of components,
        wherein the plurality of components comprises:

a printed circuit board with a front surface and a back surface located opposite with respect to the front surface of the printed circuit board;

a sensor chip arranged on the front surface of the printed circuit board and sensitive to radiation;

a plurality of signal and control connections containing contact pins and for operating the sensor chip, the contact pins being connected to the printed circuit board via bond wires;

a base plate for holding the contact pins; and a means for cooling and/or heat removal arranged on the back surface of the printed circuit board facing away from the front surface, wherein at least one of the base plate and the contact pins consists of a material having a relative permeability ($\mu_r$) of less than 1.5 selected from annealed austenitic stainless steel with material number 1.4429, 1.4406, 1.4404, 1.4301, 1.3964, 1.3960 or 1.3952.

2. The low interference sensor head according to claim 1, further comprising a housing enclosing the sensor head, wherein the housing comprises an entrance window in the area of the sensor chip and the housing consists of material having a relative permeability ($\mu_r$) of less than 1.5.

3. The low interference sensor head according to claim 2, wherein the housing consists of a material selected from the group comprising austenitic stainless steel, annealed nickel alloys, tantalum, zirconium, tungsten, platinum, palladium, titanium or mixtures thereof.

4. The low interference sensor head according to claim 1, further comprising at least one selected from adhesive layers and barrier layers disposed between at least a part of the plurality of components, wherein the at least one of adhesive layers and barrier layers has a thickness of less than 3 µm and consists of material having a relative permeability ($\mu_r$) of less than 1.5.

5. The low interference sensor head according to claim 1, wherein the material has a relative permeability ($\mu_r$) of less than 1.35.

6. The low interference sensor head according to claim 1, wherein each connection between the plurality of components is solder-free.

7. The low interference sensor head according to claim 1, wherein the means for cooling and/or heat removal comprises a thermoelectric cooling element and a base.

8. The low interference sensor head according to claim 7, wherein the base consists of copper, silver, gold or mixtures thereof.

9. The low interference sensor head according to claim 1, wherein the sensor chip is a Si(Li) detector, an HPGe detector, a PIN diode, a detector consisting of connector semiconductors, a silicon drift detector with external transistors or a silicon drift detector with integrated FET.

10. The low interference sensor head according to claim 1, wherein the printed circuit board is a multilayer compound ceramic.

11. A radiation detector comprising the low interference sensor head according to claim 1.

12. The low interference sensor head according to claim 1, further comprising a connection disposed between the plurality of components, the connection consisting of a solder having a relative permeability ($\mu_r$) of less than 1.5.

13. The low interference sensor head according to claim 12, wherein the solder contains less than 50% nickel.

14. The low interference sensor head according to claim 12, wherein the solder comprises silver, gold, copper, palladium or a mixture thereof.

* * * * *